United States Patent [19]

Russell

[11] 4,307,302
[45] Dec. 22, 1981

[54] ELECTRONIC CONTROL SYSTEM

[76] Inventor: Jack A. Russell, 1019 Harms Ave., Libertyville, Ill. 60048

[21] Appl. No.: 24,408

[22] Filed: Mar. 27, 1979

Related U.S. Application Data

[63] Continuation-in-part of Ser. No. 816,257, Jul. 18, 1977, Pat. No. 4,147,939.

[51] Int. Cl.³ ............................ H02J 3/00; G05D 3/00
[52] U.S. Cl. ...................................... 307/40; 307/116; 307/115; 318/256; 361/181; 340/635
[58] Field of Search ....................... 318/256; 361/181; 307/308, 116, 125, 115, 129, 142, 145, 155, 39, 40; 340/635, 310 R

[56] References Cited

U.S. PATENT DOCUMENTS 2,929,969   3/1960   Denysiuk ............................ 361/181

Primary Examiner—L. T. Hix
Assistant Examiner—S. D. Schreyer
Attorney, Agent, or Firm—John G. Heimovics

[57] ABSTRACT

This invention is concerned with an electronic control system that uses a common two wire lead with a plurality of detector units connected in parallel thereto in order to control a plurality of electrical loads. The common two wire lead is connected to a single master controller. Control modules or control elements have RF signals matched individually to each detector are mounted on the controller and move the loads coupled to each detector. This system finds great acceptance in regulating solenoid motors such as found in model railroad train layouts.

6 Claims, 11 Drawing Figures

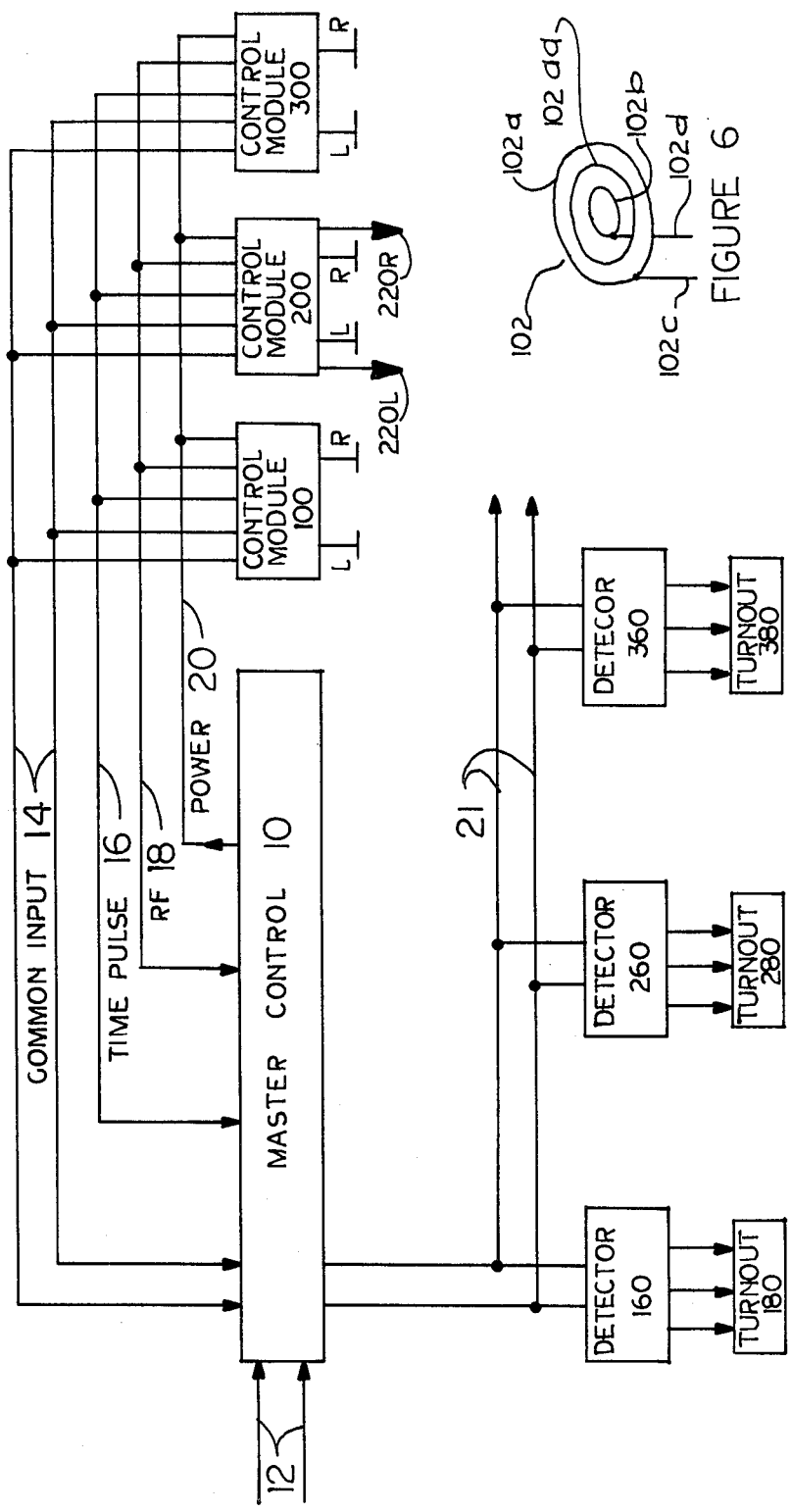
FIGURE 2
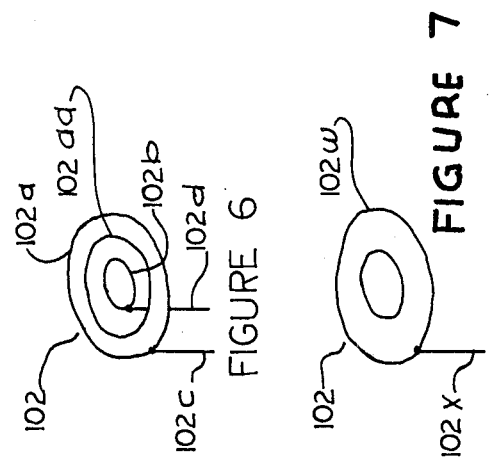
FIGURE 6
FIGURE 7

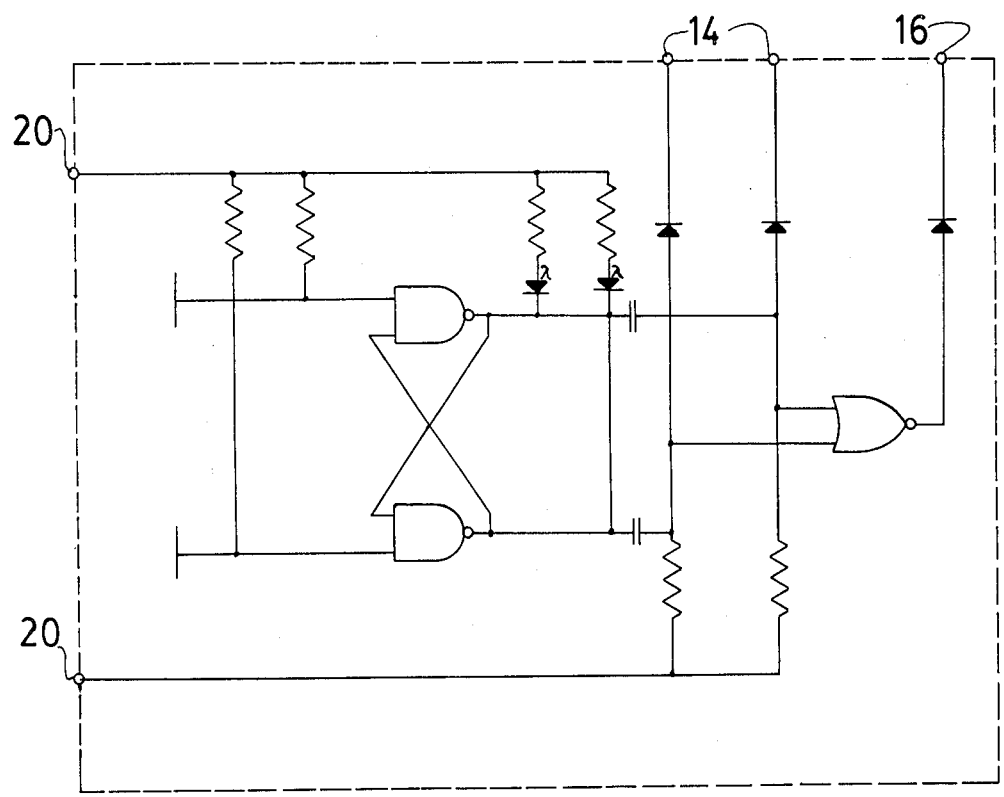
FIGURE 9 CONTROL ELEMENT
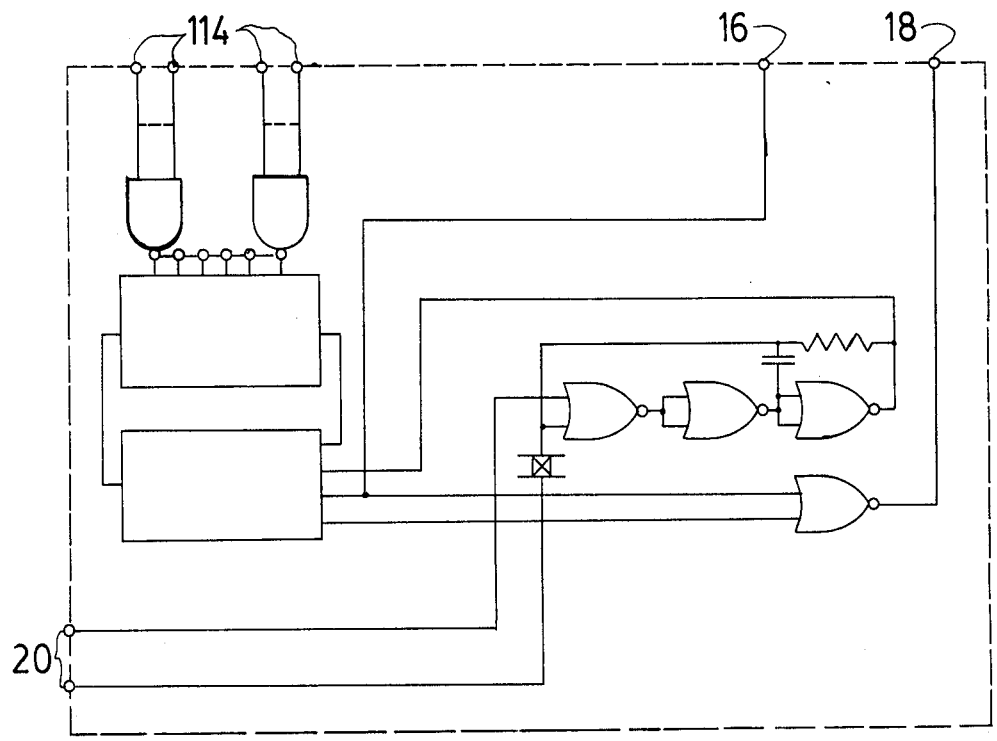
FIGURE 10 FREQUENCY GENERATOR

ELECTRONIC CONTROL SYSTEM

CROSS REFERENCE TO CO-PENDING APPLICATION

This application is a continuation-in-part application of my copending application Ser. No. 816,257 filed July 18, 1977, now U.S. Pat. No. 4,147,939.

BACKGROUND OF THE INVENTION

1. Field of the Invention

This invention relates to an electronic control system, and more particularly to an electronic control system for model railroad train switch or turnout motors.

2. Background of the Prior Art

In the past, and for the foreseeable future, an electrified model railroad train switch or turnout (used interchangeably hereinafter) included a two-way solenoid motor. This DC motor moved the switch into either a right or left hand position. After this standard switch and motor arrangement was secured into its proper location on a model railroad layout, three wires were secured to outlet posts on the motor. These wires were then strung neatly under the model railroad layout to the predetermined control panel or control location. The three wires were usually connected to a double pole button switch which was connected to an AC transformer or the AC outlet on the model train speed control transformer. When the turnout or switch was to be moved, the controller switch was moved either right or left and then pushed to make button contact. If the controller switch was marked properly (right and left position to correspond to the turnout) then the turnout would move to the desired position. This simple method works quite well for one turnout or switch. However, any reasonable model railroad layout does not have one turnout or switch. It usually has about 10 turnouts and some layouts have 25 or more turnouts. With at least 10 turnouts the wiring of the layout becomes of major concern because all the 'blocks' (a term used in model railroading to mean separately wired segments of track) greatly increase the magnitude of the wiring problems on a model railroad layout. In order to wire the 10 turnouts, thirty wires are required (3 wires per each turnout.) The combination of both sets of wiring, (1) the 'blocks' and (2) the 'turnouts' can become so overwhelming that a model railroader can be completely discouraged from making a layout. Since this problem of voluminous wires cannot be eliminated many articles in model railroad magazines, chapter upon chapter in model railroad books and even whole books have been written to assist the non-electrician model railroader in trying to keep track (not a gun) of all the wires.

Another of the vexing problems with the multiple turnout model railroad layouts is a signal lighting system so that the control panel (or control position) has signal lights to indicate whether a turnout is in the right or left hand position. There have been reports over the years in model railroad magazines that a few model railroad advocates have built very elaborate electronic gadgets for each turnout control switch in order to provide an indicator light. These gadgets, according to the reports, were only an "add-on" to the switch controller.

Nowhere has there been provided or taught:

(1) a single means for wiring a plurality of model railroad turnout or switches, all with just one single double wire strand of electrical lamp cord, where a plurality of turnouts are wired in parallel;

(2) a single touch switch to shift a turnout position not the present complicated push and touch control switch;

(3) an indicator light that constantly signals the direction and position of a turnout; and (4) a high energy DC capacity pulse that snaps a first turnout motor into position and can instantaneously snap a second turnout motor into position.

SUMMARY OF THE INVENTION

It is accordingly an object of this invention to provide an electronic control system that remotely moves the model railroad turnout from right to left, and back, having an indicator light illustrating the right or left position of the turnout.

Another object of the invention is provide a simple touch sensitive switch where a slight touch of an individual's finger can cause the turnout to move from one position (right or left) to the other.

Yet another object of the invention is to provide an electronic control for a plurality of model railroad switches that requires only a common single two wire lamp cord.

And another object of the invention is to provide a high energy capacitor pulse for actuating the turnout motor with a firm snap with the added ability of shutting off the pulse at a predetermined time.

Another object of the invention is to provide such an electronic control that has a master control with a plurality of control elements coupled to a frequency generator that can generate a plurality of specific different RF frequencies with each of such frequencies separately and independently controlling the output of a plurality of detector units which are each coupled to separate electrical loads.

Still another object of the invention is to provide such a master control unit that has a right and left switch control, reversing switch and a high energy capacitor source.

A feature of the invention is to provide such a reversing switch of the control unit with two pairs of SCR's each in series with a transistor in a bridge configuration.

Yet another important feature of the invention is to provide a plurality of control elements that control a frequency generator enabling it to produce a plurality of RF frequencies with each detector having a ceramic resonator that is capable of operating from only one of the plurality of RF frequencies emitted from the generator.

Still another feature of the invention is to provide a master control with a plurality of output control elements with common two wire output that can have a plurality of electrical loads with detector units connected directly thereto.

Other objects, features and advantages will become obvious from the following detailed description of the preferred embodiments of the invention taken together with the attached drawings.

BRIEF DESCRIPTION OF THE DRAWINGS

FIG. 2 is a block diagram of another embodiment of the invention;

FIG. 6 is a perspective view of one embodiment of a touch sensor;

FIG. 7 is a perspective view of another embodiment of a touch sensor;

FIG. 9 is a schematic electrical drawing of the control element portion of another embodiment of the invention;

FIG. 10 is a schematic electrical drawing of the frequency generator of the invention.

DESCRIPTION OF THE PREFERRED EMBODIMENTS OF THE INVENTION

Figure 1:
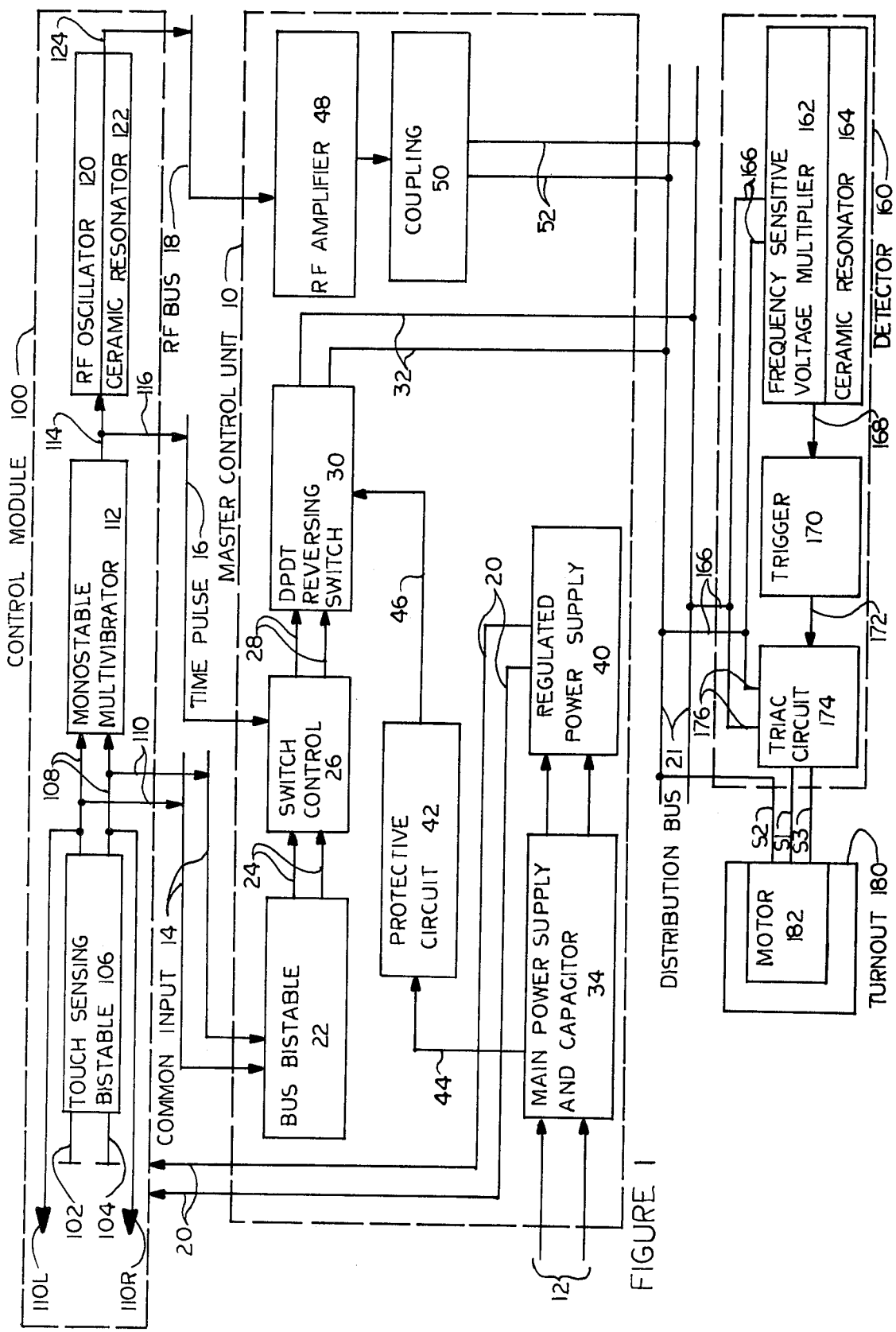
FIG. 1 is a block diagram of one embodiment of the invention.

In a preferred embodiment of the invention, a master control 10 is connected to a primary power source. The control has a common distribution bus 21 which preferably resembles a two wire lamp cord that is strung around a model railroad layout near each turnout or railroad switch. A small detector 160 is connected to the two wire distribution bus 21 and to the three terminals of the turnout's motor. A plurality of these detector-turnout combinations can all be connected to the same two wire distribution bus 21. For each detector-turnout combination a control module 100 is connected to the control 10. Each of the turnouts has a right and left or straight and curved position to which it can be moved. Each control module 100 has a pair of touch sensors 102 and 104, that correspond to the right and left positions on a turnout. The modules 100 are arranged so that only one module can control one detector 160 and only one detector 160 will accept an instruction from one module 100. Thus, with this invention, it is possible to control the right or left movements by any turnout simply by touching the right or left sensor of the matching control module.

Referring now to the drawings in a preferred embodiment of this invention, as shown in FIG. 1, there is a master control unit 10 that has an imput power source 12, a common imput bus 14, a time pulse bus 16, an RF bus 18 and a regulated power supply bus 20. A control module 100 is connected to the buses 14, 16, 18 and 20. The output of the control unit 10 consists of a single two wire distribution bus 21.

The control module 100 comprises a pair of touch sensors 102 and 104 which are connected to a touch sensing bistable 106. In one embodiment, a single touch sensor 102, as shown in FIG. 6, comprises a small disc shaped washer 102a, preferably being about the size of a standard 3/16" bolt washer. In the center of the washer 102a and spaced a small distance from the internal diameter 102aa of the washer 102a is a small metal disc 102b. Both the washer 102a and the disc 102b are mounted on any convenient type of panel (not shown.) Wire 102c connects the washer 102a to the bistable 106 and the wire 102d connects the disc 102c also to the bistable 106. The size of the washer and disc arrangement is directly related to an individual's conductance and thus determined by the sensitivity of the circuit associated therewith.

In another embodiment of the invention of the touch sensor as shown in FIG. 7, a simple washer 102w is connected by wire 102x to the bistable 106 and more precisely to the NAND gate 102y. The washer 102w and the NAND 102y comprise part of a circuit (and identical to the other washer 104 and NAND gate) that has a very low capacitance and a very high input impedance thus requiring a very small current to actuate it. There is essentially no current flow through the washer 102 or 104 and the NAND gates coupled thereto from nearby fixed objects. It is well known that the average individual's body has about 180 to 200 pico farads capacitance to earth ground. Therefore a simple touch of an individual's finger on the washer 102w or 104 creates a minute current because of the change of capacitance to ground. This is sufficient current to trigger or toggle the bistable 106.

Thus, when an individual's finger touches both the disc 102b and the washer 102a or the washer 102w, a circuit is closed and a directional pulse 1000 is issued by the bistable 106 through leads 108. If sensor 102 is touched then the LED light 110L is immediately lit and will remain on until the sensor 104 is touched and the circuit in the bistable 106 switch at which time the bistable 106 issues an opposite directional signal through leads 108. When this occurs the LED 110L goes out and the LED 110R lights up. A directional pulse from the bistable is fed into the mono-stable multivibrator 112. The multivibrator uses the pulse 1000 and issues a time signal 1002 through the lead 114 to the RF oscillator 120. The RF oscillator has a very specific ceramic resonator that operates on one specific frequency. Generally ceramic resonators have a general range of from 200 KHz to 1070 KHz and are obtainable at any specific frequency such as 205 KHz with a tolerance of plus or minus 1 KHz. For purposes of illustration a 210 KHz ceramic resonator 122 is part of the oscillator 120. The oscillator 120 accepts the time signal 1002 and issues an RF signal 1004 at 210 KHz on lead 124. The control module 100 comprises the bistable 106 with its touch sensors 102 and 104, the multivibrator 112 and the RF oscillator 120. It receives its power from the regulated power supply 40 via bus 20. The control module is arranged on a printed circuit board so that it plugs directly into sockets (not shown) of the master control 10 whereby direct contact is made with the bus 20 and contact is made with (1) the input bus 14 via leads 110; (2) the time pulse bus 16 via lead 116, and (3) the RF bus 18 via lead 124.

Preferably the master control 10 can be mounted on a printed circuit board and constructed to accept up to 10 or more control modules wherein each is separately and directly connected in parallel to the regulated power supply bus 20, the common input bus 14, the time pulse bus 16 and the RF bus 18.

A portion of the master control 10 has a power supply imput 12 that connects to the main power supply and capacitor energy section 34. The section performs two functions: (1) it provides power to the regulated power supply 40 via leads 36 and (2) it provides a stored high energy potential 1008 that will ultimately be used to drive the turnout motors. Connected to the supply 34 is a protective circuit 42 that is connected via leads 44 that prevents the capacitor circuitry of the supply 34 and associated discharge circuitry from overloading. The high energy potential 1008 is made available via lead 46. The regulated power supply 40 provides power to all parts of the device providing for internal operation and is quite similar to such circuits in many other electronic devices.

The control 10 has a bus bistable 22 that is directly connected to the input bus 14. The directional pulse 1000 which indicates that a direction has been chosen by touching the sensors 102 or 104 is accepted by the bistable 22. The circuitry of the bistable 22 is arranged to accept directional pulses. Thus, after the bistable 22 receives the pulse 1000 it reissues it to the switch control 26 in the form of a directional state 1006.

The switch control 26 not only receives the state 1006 but also the time pulse 1002 and couples the two together issuing only one directional pulse 1010 to the DPDT reversing switch 30 via leads 28. The switch control 26 comprises two pairs of NAND and NOR elements each in series and each comprises a logic circuit that is cross coupled to prevent the turning on of more than one side of the switch 30 at a time.

The reversing switch 30 receives both the directional pulse 1010 and the high energy potential 1008 and issues a directional (polarized) high energy pulse 1012 via leads 32 to the distribution bus 21. The switch has a unique construction utilizing two pair of SCR's each in series with a transistor in a bridge configuration and can be identified in FIG. 4. At the same time that the switch is issuing pulse 1012, the RF amplifier 48 has already received the RF signal 1004 via bus 18 and has amplified it preferably from 10 to 100 times. This amplified RF signal 1014 is received by the coupling 50 and transmitted to the distribution bus 21 via leads 52. The coupling 50 prevents the high capacity energy pulse 1012 on the distribution bus 21 from backing up into the RF amplifier 48 and damaging it.

A turnout 180 with a solenoid type two position motor 182 having directional leads S1 and S3 are connected directly to detector 160 while common line S2 of the motor 182 is connected to the one portion of bus 21. The frequency sensitive voltage multiplier 162 of the detector 160 has a ceramic resonator 164 that is matched at 210 KHz with the ceramic resonator 122. This permits the amplified RF pulse 1014 to be accepted by the multiplier 162. The multiplier uses the pulse 1014 to produce a high voltage DC signal 1016 and issue it to the trigger 170 via lead 168. At the same time the double diode triac circuit which is connected to the distribution bus 21 via lead 176 and 166 has available to it the high energy directional pulse 1012 which is capable of driving the motor 182. The trigger's DC signal 1016 is received by the circuit 174 and permits the pulse 1012 to pass through to the motor thus moving the motor 182 in the direction desired.

Figure 3:
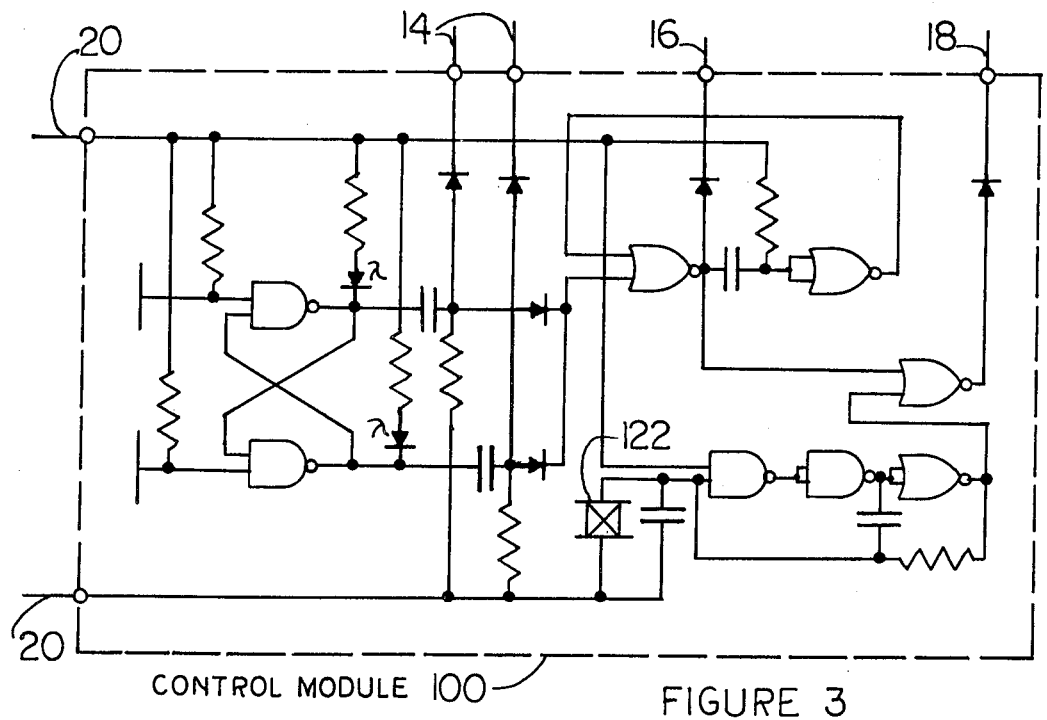
FIG. 3 is a schematic electrical drawing of the control module portion of one embodiment of the invention.
Figure 5:
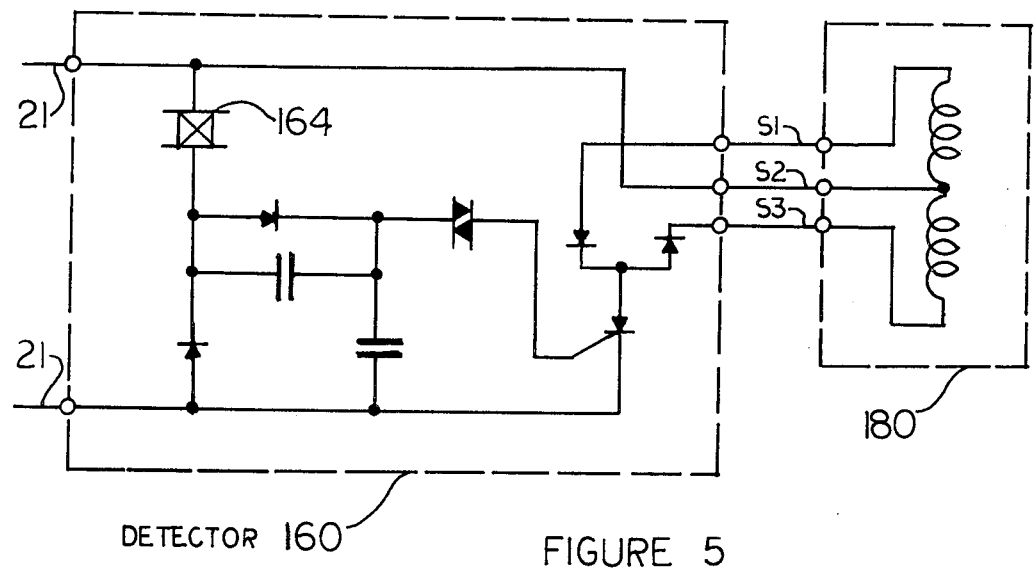
FIG. 5 is a schematic electrical drawing of the detector unit portion of one embodiment of the invention.
Figure 4:
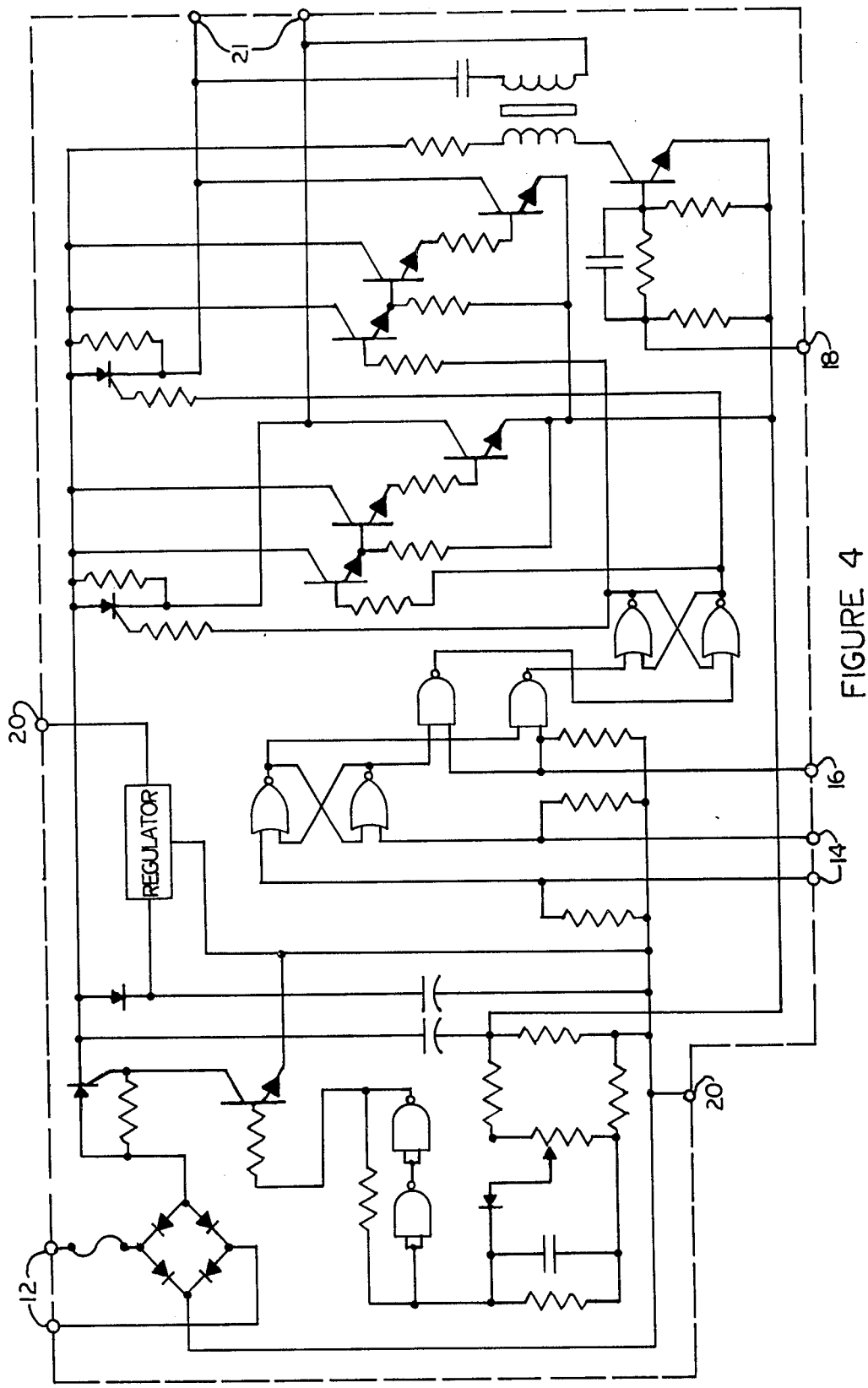
FIG. 4 is a schematic electrical drawing of the master control unit portion of one embodiment of the invention.
Figure 8:
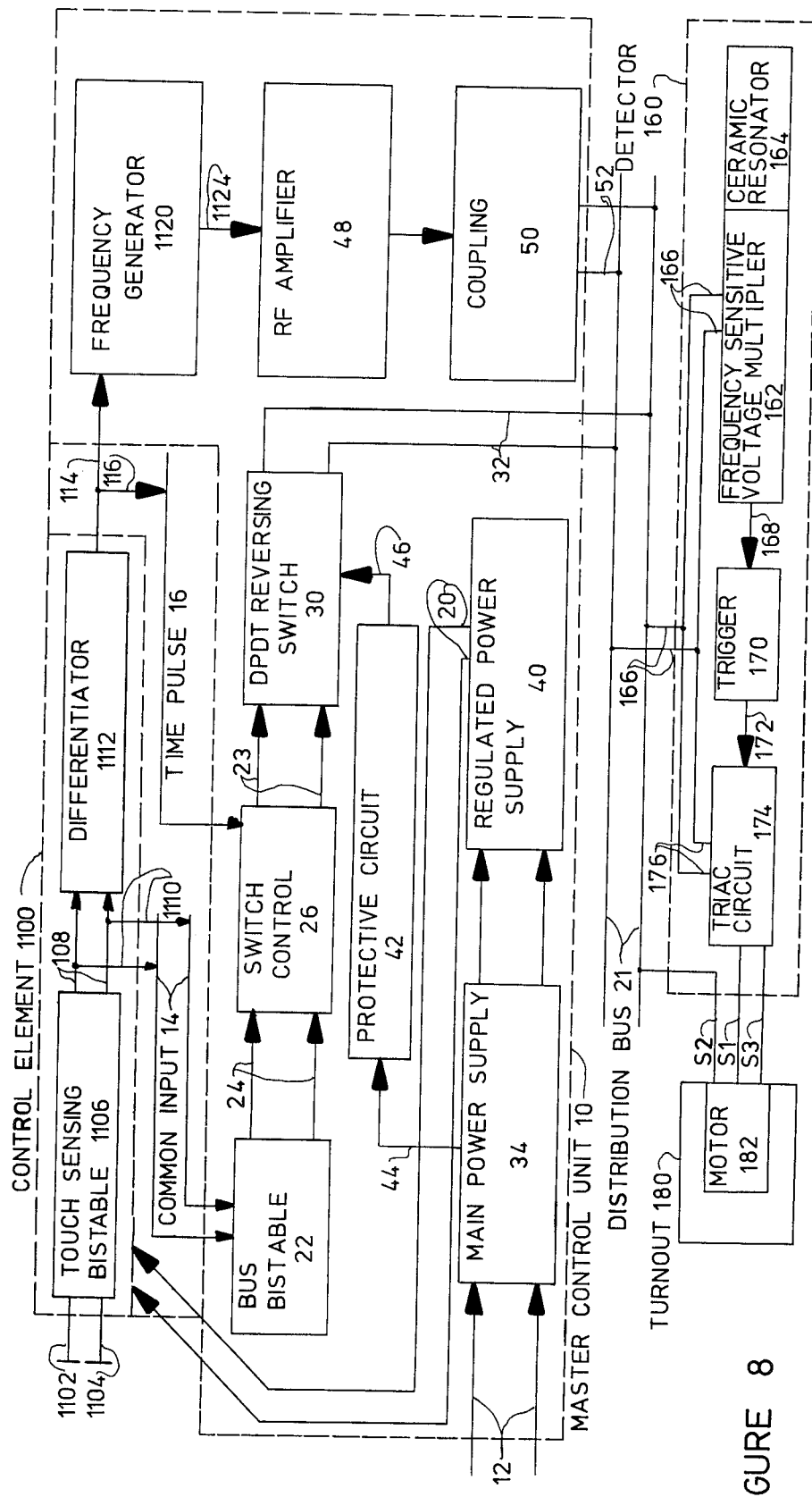
FIG. 8 is a block diagram of another embodiment of the invention.
Figure 11:
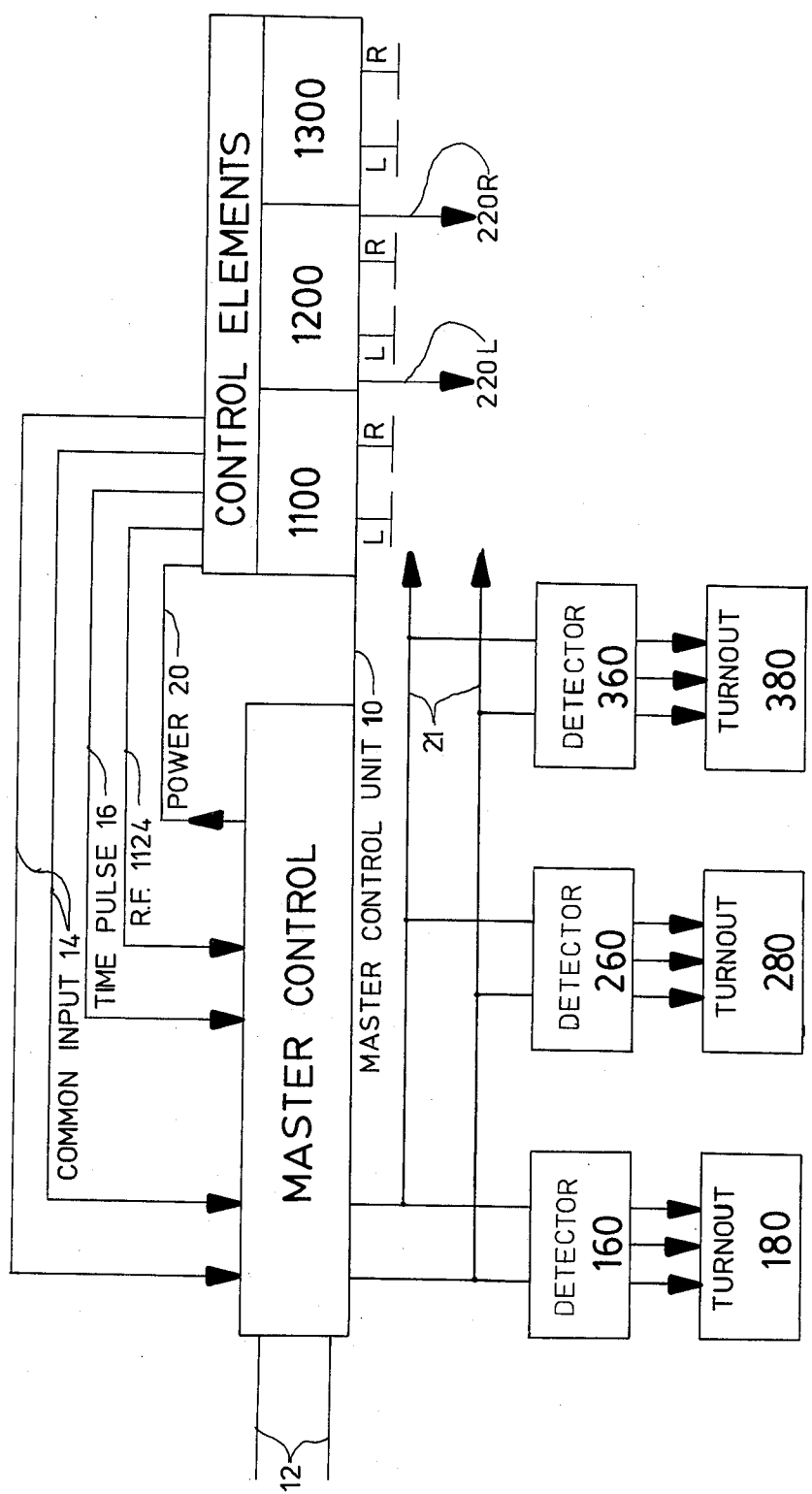
FIG. 11 is a block diagram of another embodiment of the invention.

FIGS. 3, 4 and 5 are electrical schematic drawings of one embodiment of the circuitry for the module 100, the control 10 and the detector 160. It should be noted that modifications to this circuitry which either increases or decreases the number of parts is fully contemplated and can easily be accomplished by one skilled in the art. This particular circuitry has been illustrated as it has been found to be most advantageous. Obviously, when produced in very large quantities, the circuits could be microized.

As fully contemplated, this invention can include a plurality of turnout-detector combinations each controlled by individual modules all connected to single master controller 10. As shown in FIG. 2 modules 100, 200 and 300 are all connected in parallel to buses 14, 16, 18 and 20 and detectors 160, 260 and 360 with turnouts 180, 280 and 380 all connected tin parallel to distribution bus 21. In this arrangement distribution bus 21 can be a simple two wire lamp cord. With power, either AC or DC, being supplied to control 10 the total system is operational. Each module 100, 200 and 300 has ceramic resonators with different RF frequencies.

For purposes of illustration, module 100 has a ceramic resonator with an RF frequency of 260 KHz with detector 160 having a matching ceramic resonator with the same frequency. Module 200 has a resonator with an RF frequency of 280 KHz with detector 260 having a matched 280 KHz RF frequency resonator. Module 300 has a resonator with an RF frequency of 500 KHz with detector 260 having a matched 500 KHz RF frequency resonator.

If the turnout 280 is in the left position, the light 220L will be lit. If the right sensor of module 200 is touched, the light 220L is extinguished and the light 220R is lit. At the same time a directional pulse, a time pulse and an RF signal are all issued from module 200. The master control digests all these and along with a high energy directional pulse issues an amplified RF signal at 280 KHz. All three detectors 160, 260 and 360 look at the signal and pulse. Since only detector 260 has a matched ceramic resonator of 280 KHz, it alone can utilize the signal and direct the pulse to move the motor of turnout 280.

In another embodiment of the invention, a master control 10 is connected to a primary power source. The control has a common distribution bus 21 which preferably resembles a two wire lamp cord that is strung around a model railroad layout near each turnout or railroad switch. A small detector 160 is connected to the two wire distribution bus 21 and to the three terminals of the turnout's motor. A plurality of these detector-turnout combinations can all be connected to the same two wire distribution bus 21. For each detector-turnout combination a control element 1100 is part of the control 10. As before each of the turnouts has a right and left or straight and curved position to which it can be moved. Control element 1100 has a pair of touch sensors 1102 and 1104, that correspond to the right and left positions on a turnout. The element 1100 is arranged so that only one element can control one detector and only one detector will accept an instruction from one element. Thus, with this embodiment, it is possible to control the right or left movements by any turnout simply by touching the right or left sensor of the matching control module.

Referring now to the drawings in a preferred embodiment of this invention, as shown in FIG. 8, 9, 10 and 11, there is a master control unit 10 that has an imput power source 12, a common input bus 14, a time pulse bus 16, an RF input 1124 and a regulated power supply bus 20. A control element 1100 is connected to the wires 14, 16, 1124 and 20. The output of the control unit 10 consists of a single two wire distribution bus 21. The control element 1100 comprises a pair of touch sensors 1102 and 1104 which are connected to a touch sensing bistable 1106.

When the sensor 1102 or 1104 is touched, the bistable 1106 issues a plus or minus signal level change 2000 that is fed to the differentiator 1112. The differentiator 1112 uses the change 2000 and issues a time signal 2002 through the lead 114 to the frequency generator 1120 which is part of the control 10. The frequency generator 1120 issues a specific RF frequency 2004 through lead 1124 to the RF amplifier 48 similar to the RF signal 1004.

Multiple elements 1100, 1200 and 1300 are used. They are connected differently to the multiple gate inputs (shown in FIG. 10) of the frequency generator 1120. The touching of the sensors of each of the elements 1100, 1200, and 1300 causes the frequency generator 1120 to issue different RF frequencies to the RF amplifier 48 in a manner similar to the other embodiment described. As in the other embodiments, each of the ceramic resonators of the detectors 160, 260 and 360 can only accept one RF frequency. The frequency generator 1120 is so constructed that it will issue only RF frequencies that can be accepted by the ceramic resonators. Thus, a second means for generating RF signals to turn on ceramic resonators is shown.

It has been found that when a plurality of detector units is desired in one total unit (rather than being added such as one at a time as in the modular embodiment), it is cheaper to construct the master control 10 with the frequency generator 1120 than to use matched ceramic resonators. However, if only one or two control modules are desired then the matched ceramic resonator method can be more desirable.

Thus, it is fully contemplated that many control modules or elements and detector-turnout combinations can be coupled to use only one master control.

Rather than connecting turnouts to this three part (control, master control, detector) system a series of solenoid locks all parallel connected to the same two wire lamp type cord could equally efficiently be controlled. It will be obvious that many other items besides model railroad turnouts and solenoid locks can be controlled by such a system.

Although the present invention has been described with reference to illustrative embodiments, it should be understood that numerous other modifications and changes will readily occur to those skilled in the art, and it is therefore intended by the appended claims to cover all such modifications and changes that fall within the spirit and scope of the invention.

I claim:

1. A device for electrically moving a first three-lead motor of a model railroad switch and a second three-lead motor of a model railroad switch so that each will move to back and forth or right and left positions as desired, comprising:
    (a) a master control energized by a power source with means for generating a plurality of RF signals;
    (b) a first control element capable of selecting the position of the first switch and connected to the means for generating a precise first RF signal, the element coupled to the control;
    (c) a first detector having a first ceramic resonator matched and capable of selectively receiving only the first RF signal, the detector connected to the three leads of the first motor;
    (d) a second control element capable of selecting the position of the second switch and connected to the means for generating a precise second RF signal, the second element coupled to the control;
    (e) a second detector having a second ceramic resonator matched to and capable of selectively receiving only the second RF signal; the detector connected to the three leads of the second motor; and,
    (f) means for connecting the master control and the detectors whereby a position selection by the first element is effectuated by the first motor and a position selection by the second element is effectuated by the second motor.

2. A device capable of moving a first electrical load from one position to another or to an on or off position and a second electrical load from one position to another or to an on or off position as desired, comprising:
    (a) a master control energized by a power source with means for generating a plurality of RF signals;
    (b) a first control element capable of selecting the position of the first load desired and connected to the means for generating a precise first RF signal, the element coupled to the control;
    (c) a first detector having a first ceramic resonator matched to and capable of selectively receiving only the first RF signal, the detector connected to the load;
    (d) a second control module capable of selecting the position of the second load and connected to the means for generating a precise second RF signal, the element coupled to the control;
    (e) a second detector having a second ceramic resonator matched to and capable of selectively receiving only the second RF signal, the detector connected to the load; and
    (f) means for connecting the control with the detectors whereby the positions of the loads are selected by the elements.

3. The device of claim 1 or 2 wherein the generating means is an RF frequency generator.

4. The device of claim 3 wherein the generator has a plurality of gate inputs.

5. The device of claim 4 wherein each element is connected to a different grouping of gate inputs.

6. The device of claim 5 wherein each grouping of gate inputs causes the generator to issue different RF signals.

* * * * *